United States Patent [19]

Hillman

[11] 4,255,809
[45] Mar. 10, 1981

[54] DUAL REDUNDANT ERROR DETECTION SYSTEM FOR COUNTERS

[76] Inventor: Dale A. Hillman, 2523 Lynn Ave. South, St. Louis Park, Minn. 55416

[21] Appl. No.: 90,555

[22] Filed: Nov. 2, 1979

[51] Int. Cl.³ .................. G06F 11/16; H03K 21/34
[52] U.S. Cl. .................. 371/58; 235/92 EC; 371/68
[58] Field of Search .............. 371/58, 60, 67, 68; 235/92 EC

[56] References Cited

U.S. PATENT DOCUMENTS

| | | | |
|---|---|---|---|
| 3,058,655 | 10/1962 | Arneth, Jr. | 371/58 |
| 3,578,956 | 5/1971 | McCall | 235/92 CC |
| 3,609,308 | 9/1971 | Lemon et al. | 235/92 PS |
| 3,683,345 | 8/1972 | Faulkes et al. | 340/207 P |
| 3,688,201 | 8/1972 | Pommerening | 328/133 |
| 3,745,544 | 7/1973 | Ono | 340/206 |
| 3,754,241 | 8/1973 | Maehara | 340/347 SY |
| 3,789,408 | 1/1974 | Ichihara et al. | 343/105 R |
| 3,895,293 | 7/1975 | Munz | 324/78 Z |
| 3,898,444 | 8/1975 | Cordi et al. | 235/92 EC X |
| 4,031,478 | 6/1977 | Clark | 328/134 |
| 4,131,856 | 12/1978 | Chapman | 328/155 |
| 4,189,635 | 2/1980 | Sheller | 235/92 EC |

*Primary Examiner*—Jerry Smith
*Attorney, Agent, or Firm*—Jacobson and Johnson

[57] ABSTRACT

A pair of identical multiple stage digital counters receive count advance inputs designating the occurrence of the event being monitored but with the inputs displaced so the counters do not advance simultaneously. Only the upper order stages of the counters are compared so the contents will appear equal at times and different at other times. If the compared counts are different when they should be equal or equal when they should differ, an error is indicated.

7 Claims, 3 Drawing Figures

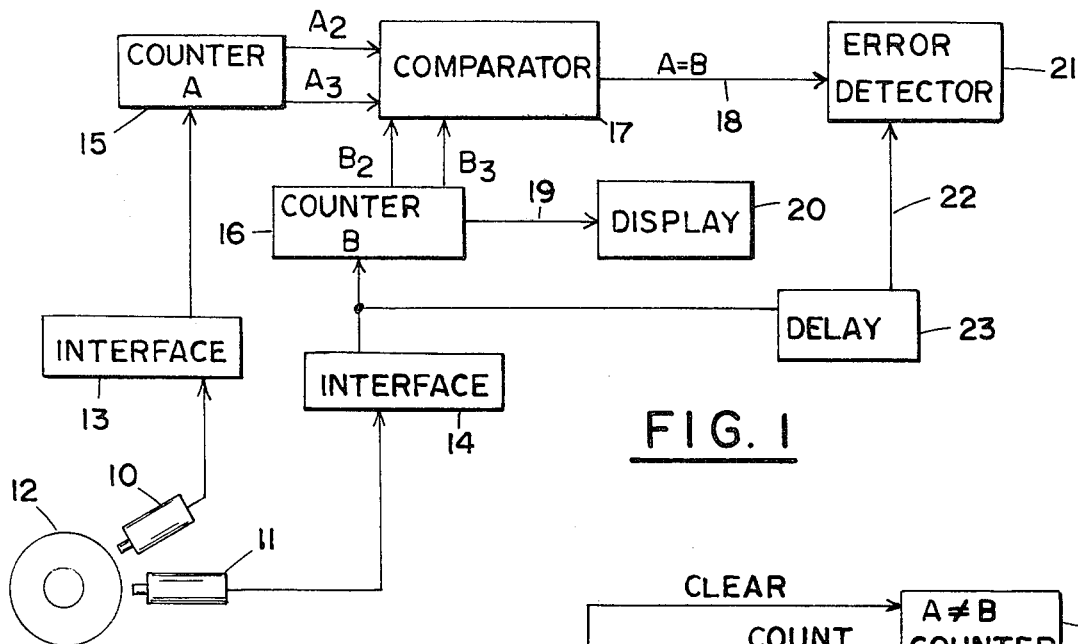
FIG. 1
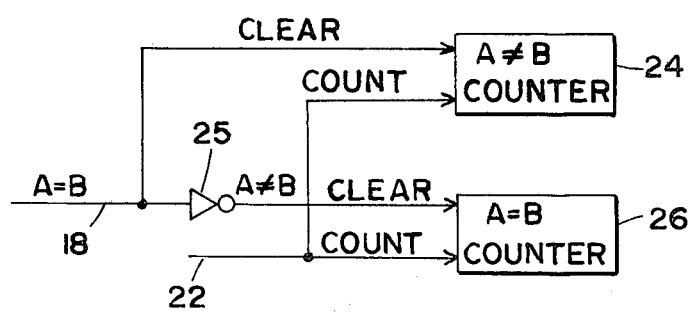
FIG. 2
| COUNTER STAGES (3)(2)(1)(0) | |
|---|---|
| 0 0 0 0 | — |
| 0 0 0 1 | EQUAL |
| 0 0 1 0 | EQUAL |
| 0 0 1 1 | EQUAL |
| 0 1 0 0 | DIFF. |
| 0 1 0 1 | EQUAL |
| 0 1 1 0 | EQUAL |
| 0 1 1 1 | EQUAL |
| 1 0 0 0 | DIFF. |
| 1 0 0 1 | EQUAL |
| 1 0 1 0 | EQUAL |
| 1 0 1 1 | EQUAL |
| 1 1 0 0 | DIFF. |
| 1 1 0 1 | EQUAL |
| 1 1 1 0 | EQUAL |
| 1 1 1 1 | EQUAL |
| 0 0 0 0 | DIFF. |
FIG. 3

DUAL REDUNDANT ERROR DETECTION SYSTEM FOR COUNTERS

BACKGROUND OF THE INVENTION

1. Field of the Invention

This invention is used with electronic sequential digital devices, such as digital counters, which are used for measuring or recording the occurrence of events or the like where it is necessary to have some assurance that the measurement or recording of the event is accurate.

2. Description of the Prior Art

There are a wide variety of systems and methods for detecting and correcting errors in measuring devices. For one example, in the field of electronic data processors the data might be accompanied by parity bits which are used by a detecting mechanism to determine if the data is correct or erroroneous. Redundancy has also been used for error prevention such as by having two identical measuring or processing devices side by side and if an error is detected in one it is turned off and the other is allowed to continue operation. Another type of redundancy system might be the use of three measuring or processing devices with their contents continually being compared so that if two out of three are equal, the majority is interpreted as being the correct value.

SUMMARY OF THE INVENTION

The present invention uses a redundancy system. The measurement is taken at the same general locations but by two separate measuring or sensing devices displaced from one another and each measurement recorded in a separate multiple stage digital counter. For ease of description, hereinafter the counters can be considered as and may be referred to as binary counters with no limitation thereto being intended. If the entire counter contents were regularly compared when one counter had advanced and the other hadn't there would be a fixed difference by virtue of the displacement between the two counting inputs. This might indicate that the counters and the associated mechanisms were operating correctly or perhaps that one counter was not operating at all or that the comparison circuitry was not operating properly. If the counters were arranged so their contents are always equal and their entire contents checked for equality, a similar interpretation could be given to the results so that there is no assurance that the device is functioning properly. In the instant invention only the higher level stages of the binary counters are compared so that at certain prescribed intervals they will appear to be equal and at certain prescribed intervals they will appear to differ. If a difference appears when the contents should be equal or if there is an indication of equality when they should differ, it indicates that an error has occurred. By introducing a difference into the contents of the two counters yet comparing them only in part so that they will appear to be equal at prescribed times and unequal at other prescribed times, any detected variation will then be a clear indication of the occurrence of an error. For example, if one counter failed to work totally, or if its input was absent, it would constantly differ from the other counter. Another example, if the comparing mechanism were not operating properly, there generally would most likely result a showing of equality or difference between the contents of the two counters each time they are compared. The instant invention, therefore, has the advantage and the ability to not only detect when an error occurs in the measurement but also to detect when an error occurs in the mechanism or circuitry which is being used to monitor the measuring device to determine if there is an error.

BRIEF DESCRIPTION OF THE DRAWING

FIG. 1 is a partial schematic and partial functional block diagram of an embodiment of the invention;

FIG. 2 illustrates in somewhat schematic form a suitable circuit for the error detector; and FIG. 3 is a logical truth table for a four bit binary counter used in the embodiment shown in in FIG. 1.

DESCRIPTION OF THE PREFERRED EMBODIMENT

Even though it will become apparent that the instant invention has wide applications, for clarity and ease of description, it will be described as used in a specific application which will be referred to as a crane counter. In operating an overhead crane the operator has to judge the vertical location of the hook when using it to make deliveries at elevated places. To assist the operator he can be provided with a visual display showing the number of feet that the hook is elevated. This display may be produced by sensing and recording the movement of the pulley for the hook cable using the amount of rotation of the pulley and transforming it into a corresponding number of feet that the cable moves and, correspondingly, the elevation of the hook. Typically, this may be done by having a suitable sensing device located adjacent the pulley with a probe which is sensitized in some fashion by the motion of the pulley so that as the pulley rotates, a signal is produced, for example, an electrical pulse signal, which can then be fed as an advance signal into a counter and the number of pulses counted and transformed into a corresponding measurement of distance. The description to this juncture is not of anything unique or unusual. One of ordinary skill in the art can easily select a suitable sensor; suitable interface circuitry whereby the sensor can produce a signal suitable for applying as a count advance input into a counter; a suitable circuit for transforming the count in electrical form into distance; and a suitable display device.

In the instant invention a pair of sensors 10 and 11, which are displaced from one another along the periphery of a pulley 12, sense and detect the rotational movement of the pulley. Typically, the pulley might have a magnetic spot and the senors 10 and 11 can be magnetic detection units and as the magnetic spot passes the sensor heads, an electrical signal is produced by the sensors. Assuming the pulley is moving in a counterclockwise direction, sensor 11 would first produce a signal from a magnetic spot and later the same magnetic spot would cause a signal to be produced by sensor 10. The electrical signals from the sensors are fed into suitable corresponding interface circuits 13 and 14 which merely converts the electrical signal from the sensor into suitable form for use in the remainder of the circuit. The output of interface circuit 13 is fed into the count advance input of a four-bit binary counter 15, sometimes herein referred to as counter A, and the output of the interface circuit 14 is fed into the count advance input of a four-bit binary counter 16, sometimes B. Counters 15 and 16 are not advanced or incremented simultaneously because of the displacement between their respective sensors. The signal state of the two highest order stages, A2 and A3, of counter 15 and the two highest order stages B2 and B3, of counter 16 are fed into a comparator circuit 17. In comparator 17 the electrical signal representations of the content of the upper two levels of counters 15 and 16 are compared and when they are equal a signal indication of equality, A=B, appears on signal line 18. The circuitry for comparator 17 is not considered unique or important to this invention. One of ordinary skill in the art can readily design or obtain commercially a suitable circuit which will perform the necessary function. For example, an integrated circuit chip designated as MM74 C85 manufactured by National Semiconductor, with suitable wiring, can be used. The signal indication of the content of the binary counter 16 is also fed into a display device 20 via signal line 19 where the content of counter 16 is visually displayed only transformed into distance to give the operator a visual indication of the height of the hook.

Typically, in the comparator 17 the content of the highest level stage of counters 15 and 16, A3 and B3 respectively, are compared and the content of the second highest level stages, A2 and B2, are compared. If both pair are equal, then signal line 18 carries a high signal indicating equality. If there is a difference, signal line 18 is low.

Signal line 18 provides an input to error detector 21. Another input to error detector 21 is on signal line 22 from delay circuit 23 which provides a delayed signal from the interface circuit 14 coupled to sensor 11. The reason for the delayed signal from sensor 11 will be explained later. In the error detector 21, the signal indication of A=B when signal line 18 is high is fed into the clearing input of A≠B counter 24 and after inversion through inverter 25, is also fed into the clearing input of A=B counter 26. The delayed signal from sensor 11 on signal line 22 is fed into the counting input of both counters 24 and 26.

When pulley 12 turns counterclockwise, the movement is detected first by sensor 11 which produces a suitable signal to be applied to the count advance input of the four-bit binary counter 16 to increment the count by one. At that juncture the total count contained in the two counters 15 and 16 will be unequal. However, if the comparison is made only of the upper level stages of the counters, it may be that there will be an indication that the contents are equal. The truth table in FIG. 3 shows the state of the various bits or stages of the four-bit counters as each counting pulse is applied. If the comparison is made after counter 16 is incremented but before counter 15 is, counter 16 can be assumed to be one count ahead of counter 15 when the comparison is made and the contents can be visually compared by comparing adjacent rows in the truth table. Assuming initially both counters are clear, the first counting signal applied to counter 16 will produce a difference only at the lowest order stage of the two counters so a comparison of the upper two stages will give an indication of equality. Continuing on, it can be observed that only after the fourth count, when counter 16 contains 0100 (decimal 4) and counter 15 contains 0011 (decimal 3) that a difference is detected between the content of the second highest order stages A2 and B2. From then on the comparison shows equality until the count advance pulse occurs which changes counter 16 from 0111 to 1000 (from decimal 7 to decimal 8), while counter 15 remains at 0111. The other instances where an inequality occurs can be observed from the truth table. So, for the first three count advance signals from sensor 11, comparator 17 will produce a signal indication of A=B on line 18 into the error detector circuit 21 and on the fourth count signal from sensor 11 the signal indication on line 18 goes low. At the same time, the signal produced by sensor 11 appears, delayed slightly, at the count input of A=B counter 26 to advance it one for each pulse. Therefore, counter 26 will count up to three until the comparator shows that the contents of counters 15 and 16 are no longer equal and counter 26 will be cleared by the A≠B signal indication applied to its clearing input. A=B counter 26 will then have counted up to three and on the fourth count will have been cleared out. Meanwhile, A≠B counter 24 will have remained at zero count by virtue of the A=B signal on its clearing input but will be advanced to one by virtue of the A=B signal being low and a count signal being present from sensor 11 on line 22. On the next signal from sensor 11 the comparator output again will show A=B so the signals on lines 18 and 22 will cause counter 26 to advance and counter 24 to clear. This sequence should continue unaltered if the circuit is operating properly. Meanwhile, of course, the display shown on display 20 is an accurate representation of the location of the hook as determined by the rotation of the pulley and as counted by counter 16. Should an error occur, it can be observed that a number of things could take place. For example, the comparator might show a constant difference between the contents of counters 15 and 16 so that the A≠B counter 24 will be continually advanced while no input appears at the A=B counter 26. There might also be only a momentary fault which could cause the A=B counter 26 to advance to and perhaps beyond decimal four. This also then would be detected. It is also possible that comparator 16 might show repeated equality between the contents of counters 15 and 16 so that the A=B counter 24 would remain at zero and the A=B counter 26 would continually be advanced. All of these indications can be used to monitor the operation of the system. Suitable circuitry can be developed to use the output of the A=B counter 26 and/or the A≠B counter 24 to trigger some type of an alarm or warning device or to initiate corrective action when an error is detected. It is not intended by this invention to provide or describe the type of circuitry that can be used to monitor the operation of counters 24 and 26 to produce the required indications or initiate the corrective action. This is left to one of ordinary skill in the art depending upon the particular application.

The reason for delay circuit 23 is to ensure that the results of the comparison of the counter contents are not applied to the error detector circuitry during a transition, i.e. when the content of a counter 16 is being changed. By delaying the application of the signal developed by sensor 11 to the count inputs of counters 24 and 26 in the error detector 21 until a short time after counter 16 has received the same signal, it ensures that counter 16 has stablilized. Of course, the delay must be less than the time for the pulley to rotate to produce a corresponding signal from sensor 10.

It should also be noted that although the description herein, for simplicity, has dealt only with count advance signals, pulley 12 could rotate clockwise to decrease the content of counters 15 and 16 and suitable circuitry must be provided to take care of that situation. That also is left to the choice of one of ordinary skill in the art.

While the instant invention has been described as used in conjunction with an overhead crane, it is clear that the advantages and the features of the invention are equally available and obtainable when used in other applications. The crane application was merely intended to be illustrative and not limitive.

It should also be clear that the selection of using a four-bit binary counter was arbitrary and counters having greater counting capacity can be used to similar advantage. It is suggested that the counters have at least three stages otherwise it becomes difficult to detect sporadic errors.

I claim:

1. A method for detecting errors when using a multistage counter as a measuring device by feeding it count advance signals comprising the steps of:
   a. feeding a count advance input signal into another multistage counter which is displaced from the count advance input signal being fed into the measuring counter so that the counters do not advance simultaneously;
   b. comparing the contents of the two counters except for at least their lowest order counter stages; and
   c. counting the instances when the comparison shows a difference and when the comparison shows equality.

2. The method as described in claim 1 wherein the counting in step c is done when comparing the counters contents after one of the counters has been advanced but before the other has been advanced.

3. The method as described in claim 1 further including: controlling the counting in step c with the count advance input signal which is fed into one of the multistage counters.

4. A dual redundant error detection system for a counter comprising:
   a. a pair of identical multiple stage counters;
   b. means for feeding counting advance input signals to each of said counters from the same source but displaced from one another so that the counters do not advance simultaneously;
   c. means for comparing the content of the two counters except for at least the lowest order stages for detecting when the compared contents are equal or different; and
   d. means responsive to said comparing means for counting when the compared contents are equal and when they are different when one of the counters has been advanced and before the other has been advanced.

5. The error detection system as in claim 4 further including: means for controlling the counting means in d with the count advance input signal which is fed to one of said multiple stage counters.

6. A measuring system having dual redundance error detection, comprising:
   a. a first sensor for producing a signal upon occurrence of an event;
   b. a second sensor displaced from said first sensor for producing a similar signal upon the occurrence of said event;
   c. a first multistage counter coupled to said first sensor for counting the occurrences of said event;
   d. a second counter identical to said first counter coupled to said second sensor for counting the occurrences of said event, the content of said second counter being advanced at a different time than the first counter due to the displacement of the second sensor;
   e. comparator means for comparing the contents of the two counters except for at least the lowest order stages; and
   f. means for recording when the compared contents are equal and when they are different at the time when one of the counters has been advanced and before the other has been advanced.

7. The system as described in claim 6 further including means for controlling the recording means of f with the signal from said first ensor.

* * * * *